(12) United States Patent
Lee et al.

(10) Patent No.: US 7,364,837 B2
(45) Date of Patent: Apr. 29, 2008

(54) METHOD FOR PATTERN FORMATION USING PHOTORESIST CLEANING SOLUTION

(75) Inventors: Won Wook Lee, Gyeonggi-do (KR); Geun Su Lee, Yongin-si (KR); Sam Young Kim, Gyeonggi-do (KR)

(73) Assignee: Hynix Semiconductor Inc., Icheon-shi (KR)

( * ) Notice: Subject to any disclaimer, the term of this patent is extended or adjusted under 35 U.S.C. 154(b) by 0 days.

(21) Appl. No.: 11/835,082

(22) Filed: Aug. 7, 2007

(65) Prior Publication Data
US 2007/0269752 A1 Nov. 22, 2007

Related U.S. Application Data

(62) Division of application No. 10/996,636, filed on Nov. 23, 2004, now abandoned.

(30) Foreign Application Priority Data
Nov. 25, 2003 (KR) .................. 10-2003-0084086

(51) Int. Cl.
G03F 7/00 (2006.01)
G03F 7/38 (2006.01)
(52) U.S. Cl. .................. 430/311; 430/335; 430/329
(58) Field of Classification Search .............. 430/311, 430/329, 335; 252/520
See application file for complete search history.

(56) References Cited

U.S. PATENT DOCUMENTS 6,783,434 B1 * 8/2004 Akahori et al. .............. 451/41

(Continued)

FOREIGN PATENT DOCUMENTS

JP 2003-289060 10/2003

(Continued)

OTHER PUBLICATIONS

Translation of Notice of Rejection in Counterpart Korean Patent Application No. 10-2003-0084086 dated Mar. 28, 2006.

(Continued)

Primary Examiner—Amanda Walke
(74) Attorney, Agent, or Firm—Marshall, Gerstein & Borun LLP

(57) ABSTRACT

Photoresist cleaning solutions are used to clean semiconductor substrates before or after an exposing step when photoresist patterns are formed. The cleaning solutions include $H_2O$ and a nonionic surfactant compound represented by Formula 1. By spraying the disclosed cleaning solutions on a surface of the semiconductor substrate before or after exposing step to form a photoresist pattern, the desired pattern only is obtained and unnecessary patterns generated in undesired regions by ghost images are avoided as excess acid generated by the photoacid generator is neutralized and removed and damage to unexposed portions of the photoresist polymer is avoided.

Formula 1

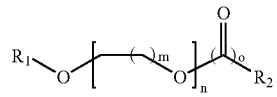

wherein $R_1$ and $R_2$ are independently H, $C_1$-$C_{20}$ alkyl, $C_5$-$C_{25}$ alkyl aryl or $C_1$-$C_{10}$ ester; m is 1 or 2; n is an integer ranging from 10 to 300; and o is 0 or 1.

16 Claims, 3 Drawing Sheets

U.S. PATENT DOCUMENTS 6,786,945 B2 * 9/2004 Machii et al. ................ 51/307

FOREIGN PATENT DOCUMENTS

KR 2003-0048545 6/2003

OTHER PUBLICATIONS

Prince, "Semiconductor Memories," 2nd ed., Wiley, p. 9, 90-91 (1991).

Notice of rejection in corresponding Korean Application No. 2003-84086 dated Sep. 27, 2006.

* cited by examiner

METHOD FOR PATTERN FORMATION USING PHOTORESIST CLEANING SOLUTION

CROSS-REFERENCE TO RELATED APPLICATIONS

This is a divisional of U.S. application Ser. No. 10/996,636 filed Nov. 23, 2004, now abandoned which claims the priority benefit of KR 2003-84086 filed Nov. 29, 2003, the respective disclosure of which are incorporated herein by reference.

BACKGROUND

1. Technical Field

Photoresist cleaning solutions for rinsing semiconductor substrates before or after an exposing step during photoresist pattern formation are disclosed. More specifically, photoresist cleaning solutions are disclosed which comprise $H_2O$ and a nonionic surfactant compound as an additive. Methods for forming a photoresist pattern using the same are also disclosed.

2. Description of the Related Art

Conventional methods for forming photoresist patterns on a semiconductor substrate comprise forming an underlying layer on a semiconductor substrate, forming a photoresist film on the underlying layer, and then exposing the photoresist film to light and developing the exposed film to obtain a photoresist pattern on a part of the underlying layer to be exposed. When a positive-type photoresist film is used, the photoresist film of the exposed region is removed by a developing solution to form the photoresist pattern.

When a photoacid generator is irradiated by a light source, it generates acid. After exposure to the light source, main chains or branched chains of polymer matrix react with the generated acid and are decomposed or cross-linked, so that the polarity of the polymer matrix is considerably altered. This alteration in polarity of the polymer matrix results in solubility differences between the exposed and the unexposed portions of the polymer in the developing solution. As a result, the exposed portions that have reacted with the acid dissolve in the developing solution and are removed.

Meanwhile, acid is also generated from the photoresist film in the unexposed area by ghost images formed in undesired regions during exposing step. The amount of acid generated by the ghost images is relatively small compared to the acid generated in the exposed area. However, the protecting group of the polymer compound in the photoresist can be detached during the baking step by small amounts of acid, so that the unexposed photoresist is dissolved in the developing solution and an undesired pattern is formed in the unexposed area. Therefore, a solution to this problem of acid damage to the unexposed photoresist polymers is needed.

SUMMARY OF THE DISCLOSURE

Photoresist cleaning solutions are provided that avoid undesired photoresist patterns caused by ghost images. The disclosed cleaning solutions neutralize or wash out small amount of acid generated in an area of a photoresist film that is not exposed to light. The cleaning solutions can be used before or after the exposing step to prevent diffusion of generated acid. Methods for forming a photoresist pattern using the disclosed photoresist cleaning solution are also disclosed.

DETAILED DESCRIPTION OF THE PRESENTLY PREFERRED EMBODIMENTS

Figure 1:
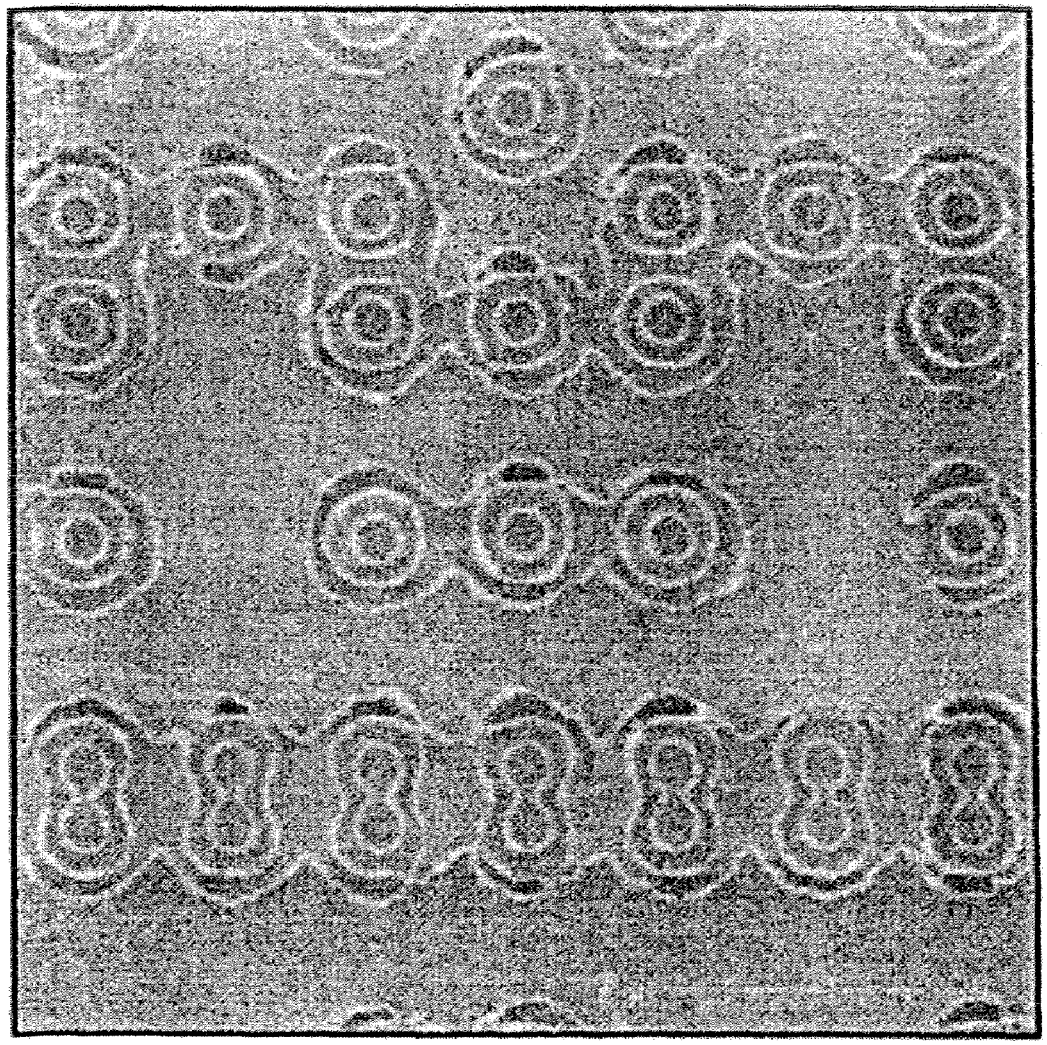
FIG. 1 is a photograph illustrating a photoresist pattern obtained from Comparative Example.

Photoresist cleaning solutions are disclosed comprising $H_2O$ as a primary ingredient and a nonionic surfactant compound represented by Formula 1 as an additive:

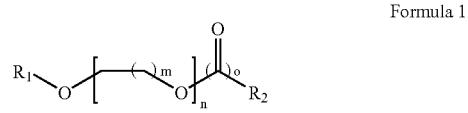

Formula 1 wherein $R_1$ and $R_2$ are independently H, $C_1$-$C_{20}$ alkyl, $C_5$-$C_{25}$ alkyl aryl or $C_1$-$C_{10}$ ester;

m is 1 or 2;

n is an integer ranging from 10 to 300; and o is 0 or 1.

Preferably, $R_1$ and $R_2$ are independently H, $C_1$-$C_{12}$ alkyl, $C_{12}$-$C_{20}$ alkyl aryl or $C_1$-$C_8$ ester; and n is an integer ranging from 50 to 150. $R_1$ and $R_2$ are more preferably independently selected from the group consisting of H, octyl, octyl phenyl, nonyl, nonyl phenyl, decyl, decyl phenyl, undecyl, undecyl phenyl, dodecyl and dodecyl phenyl. A specific example for the compound of Formula 1 is polyethylene glycol or polyethylene glycol monolaurate.

$H_2O$ as a primary ingredient in the cleaning solutions is preferably distilled water.

Also, the photoresist cleaning solutions may further comprise an alcohol.

The alcohol is preferably selected from the group consisting of $C_1$-$C_{10}$ alkyl alcohol and $C_1$-$C_{10}$ alkoxyalkyl alcohol. Preferably, the $C_1$-$C_{10}$ alkyl alcohol is selected from the group consisting of methanol, ethanol, propanol, isopropanol, n-butanol, sec-butanol, t-butanol, 1-pentanol, 2-pentanol, 3-pentanol, 2,2-dimethyl-1-propanol. Also, the $C_1$-$C_{10}$ alkoxyalkyl alcohol is preferably selected from the group consisting of 2-methoxyethanol, 2-(2-methoxyethoxy)ethanol, 1-methoxy-2-propanol, 3-methoxy-1,2-propanediol and mixtures thereof.

When the disclosed photoresist cleaning solutions are used after the exposure step, they neutralize or wash out the small amount of acid generated in unexposed, undesirable or ghost image regions of the photoresist film. In addition, when the cleaning solutions are applied before the exposing step, acid generated after the exposing step diffuses slowly due to a thin water screen formed on the surface of the photoresist film, and small amounts of a photoacid generator may be washed out so that amount of generated acid is reduced in the subsequent exposure step.

In the disclosed photoresist cleaning solutions, the content of the nonionic surfactant compound of Formula 1 preferably ranges from 0.001 to 1 wt %, more preferably, from 0.005 to 0.05 wt %, based on total weight of the solution.

When the compound of Formula 1 is used in the amount of less than 0.001 wt %, the solution does not clean the photoresist film efficiently and patterns are formed in the undesired regions. When the compound of Formula 1 is used in the amount exceeding 1 wt %, the compound of Formula 1 may react with the photoresist, resulting in pattern deformation.

In the disclosed photoresist cleaning solutions, the content of the alcohol preferably ranges from 0 to 10 wt %, preferably from 0 to 5 wt %. The alcohol is optional and need not be used at all. However, when an alcohol is used, it is preferably used in the amount of at least 0.01 wt %.

When an alcohol is used in an amount greater than 10 wt %, the alcohol may dissolve the photoresist, resulting in pattern collapse.

The disclosed cleaning solutions are prepared by filtering a mixture solution comprising $H_2O$, the compound of Formula 1 and an alcohol with 0.2 µm filter.

A disclosed method for forming a photoresist pattern on a semiconductor substrate comprise conducting a photoresist cleaning step using a disclosed cleaning solution before or after the exposing step in addition to the conventional pattern formation process comprising exposing and developing steps.

An embodiment of a disclosed pattern formation method comprises:
(a) coating a photoresist on the surface of an underlying layer formed on a semiconductor substrate to form a photoresist film;
(b) soft-baking the photoresist film;
(c) exposing the photoresist film to light;
(d) cleaning the photoresist film using a disclosed cleaning solution;
(e) post-baking the photoresist film; and
(f) developing the photoresist film to form a photoresist pattern.

Herein, step (d) is performed by spraying the cleaning solutions from upper portion of a spin apparatus while spinning the semiconductor substrate.

As described above, by washing the photoresist film with the cleaning solutions after the exposing step, acid generated in small amounts on undesired regions of the photoresist film surface is neutralized or washed.

In another embodiment, a method for forming a photoresist pattern comprises:
(a) coating a photoresist on the surface of an underlying layer formed on a semiconductor substrate to form a photoresist film;
(b) cleaning the photoresist film using a disclosed cleaning solution,
(c) soft-baking the photoresist film;
(d) exposing the photoresist film to light;
(e) post-baking the photoresist film; and
(f) developing the photoresist film to form a photoresist pattern.

Step (b) is performed by spraying the cleaning solutions from upper portion of a spin apparatus while spinning the semiconductor substrate.

When the photoresist film is washed with the cleaning solutions before exposing acid generated after the exposing step diffuses slowly due to a thin water screen formed on the surface of the photoresist film and small amount of a photoacid generator in a photoresist composition can be washed out so that amount of acid to be generated is reduced in the subsequent exposing step.

In the above method, the cleaning the photoresist film using the photoresist cleaning solutions may be further performed after step (d) and before step (e).

Preferably, the baking step is performed at a temperature ranging from 70 to 200° C.

Preferably, exposing is performed using the exposure light selected from the group consisting of KrF (248 nm), ArF (193 nm), VUV (157 nm), EUV (13 nm), E-beam, X-ray and ion beam, and at an exposure energy ranging from 0.1 to 50 mJ/cm$^2$.

The developing step is performed using an alkali developing solution, preferably TMAH aqueous solution a concentration ranging from 0.01 to 5 wt %.

Additionally, there is provided a semiconductor device fabricated using the above-described method.

The disclosed cleaning solutions and pattern formation methods will now be described in greater detail by referring to the following examples, which are not intended to limit the scope of this disclosure.

EXAMPLE 1

Preparation of Cleaning Solutions (1)

0.1 g of polyethylene glycol having an average molecular weight of 4,600, and 1,000 g of $H_2O$ were mixed and stirred for 1 minute. The resulting mixture was filtered through 0.2 µm filter to obtain a cleaning solution composition of the present invention.

EXAMPLE 2

Preparation of Cleaning Solutions (2)

0.1 g of polyethylene glycol monolaurate having an average molecular weight of 3,900, 30 g of ethanol and 970 g of $H_2O$ were mixed and stirred for 1 minute. The resulting mixture was filtered through 0.2 µm filter to obtain a cleaning solution composition of the present invention.

Comparative Example 1

Formation of Photoresist Pattern (1)

An underlying layer was formed on a silicon wafer treated with hexamethyldisilazane (HMDS), and TarF-7a-39 product of TOK Co., Ltd., a methacrylate-type photosensitizer, was spin-coated on the surface of the underlying layer to form a photoresist film at thickness of 3,500 Å. Then, the photoresist film was soft-baked in an oven at 130° C. for 90 seconds. After soft-baking, the photoresist film was exposed to light using an ArF laser exposure device, and then post-baked in the oven at 130° C. for 90 seconds. When the post-baking was completed, the silicon wafer was dipped and developed in a 2.38 wt % aqueous tetramethylammonium hydroxide (TMAH) solution for 30 seconds to obtain a 150 nm contact hole pattern. However, it was found that patterns were also formed in undesired regions (see FIG. 1).

EXAMPLE 3

Formation of Photoresist Pattern (2)

An underlying layer was formed on a silicon wafer treated with HMDS, and TarF-7a-39 product of TOK Co., Ltd., a methacrylate-type photosensitizer, was spin-coated on the surface of the underlying layer to form a photoresist film at thickness of 3,500 Å. Then, the photoresist film was soft-baked in an oven at 130° C. for 90 seconds. After soft-baking, the photoresist film was exposed to light using an ArF laser exposure device, and 100 mL of the cleaning solution composition obtained from Example 1 was sprayed on the photoresist film from upper portion of a spin device while the silicon wafer was spun on a spin device.

Figure 2:
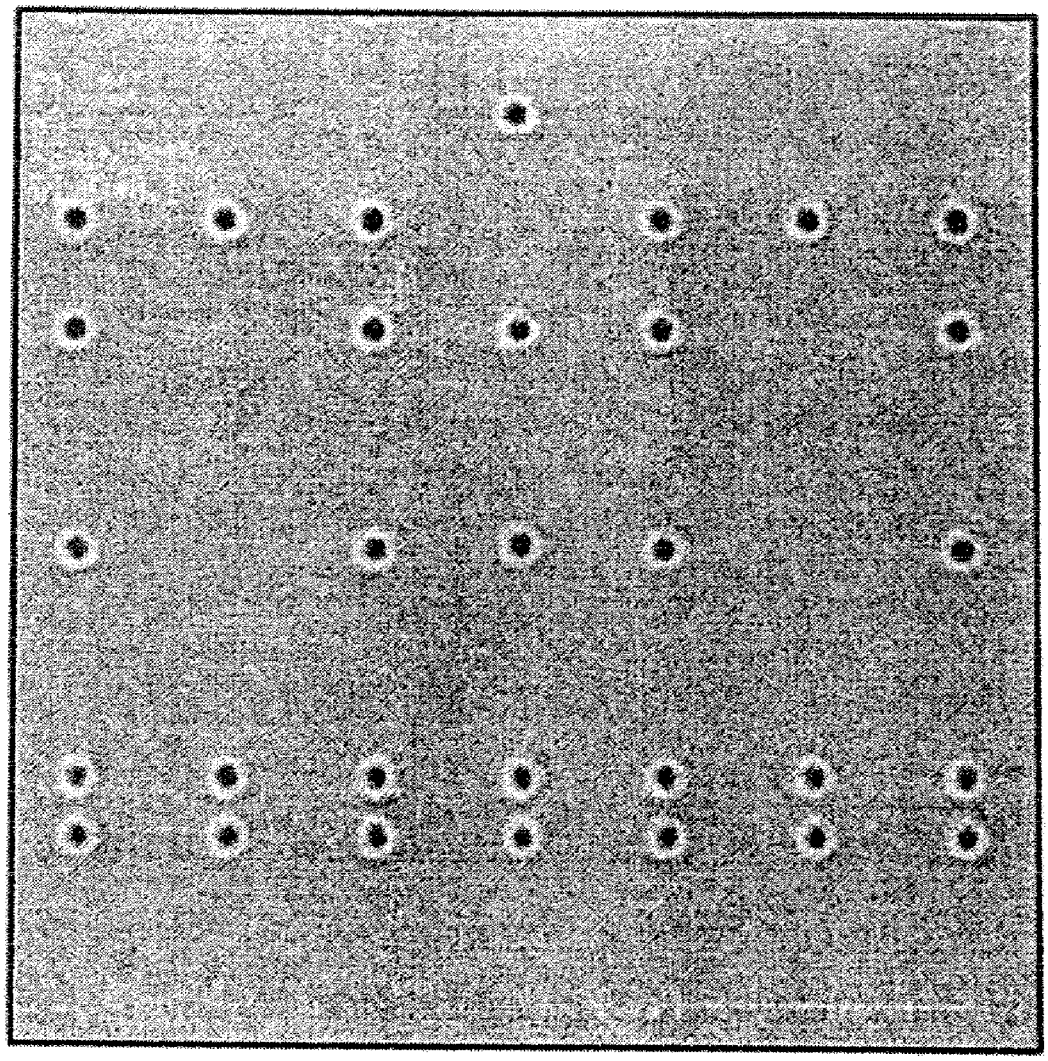
FIG. 2 is a photograph illustrating a photoresist pattern obtained from Example 3.

Then, the photoresist film was post-baked in the oven at 130° C. for 90 seconds, and then developed in a 2.38 wt. % aqueous TMAH solution for 30 seconds to obtain a 150 nm contact hole pattern (see FIG. 2). As a result, it was found that no pattern was formed in the undesired regions in comparison with FIG. 1.

EXAMPLE 4

Formation of Photoresist Pattern (3)

An underlying layer was formed on a silicon wafer treated with HMDS, and TarF-7a-39 produced by TOK Co., Ltd., a methacrylate-type photosensitizer, was spin-coated as on the surface of the underlying layer to form a photoresist film at thickness of 3,500 Å. Then, the photoresist film was soft-baked in an oven at 130° C. for 90 seconds. After soft-baking, the photoresist film was exposed to light using an ArF laser exposure device, and 100 mL of the cleaning solutions from Example 2 was sprayed on the photoresist film from upper portion of a spin device as the silicon wafer was spun on a spin device.

Figure 3:
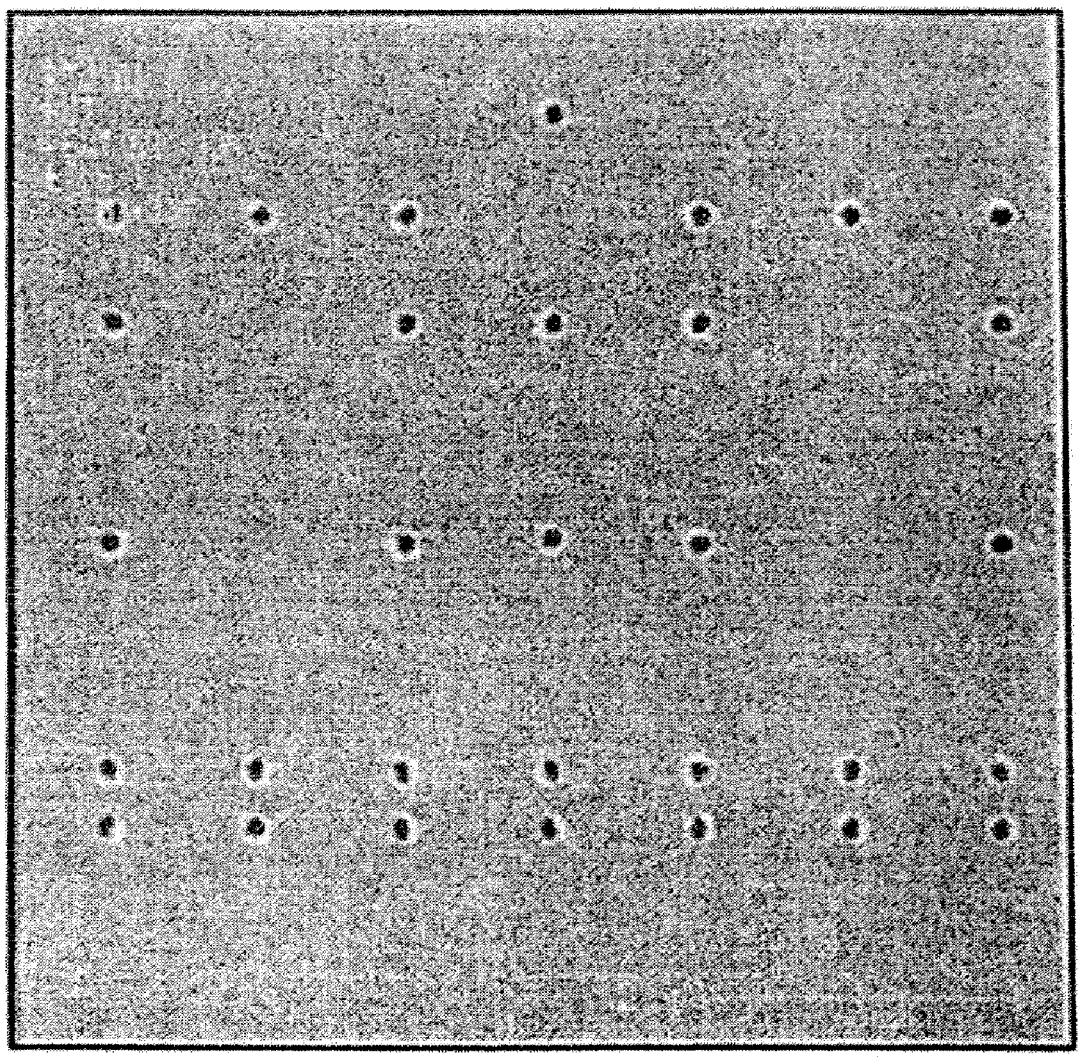
FIG. 3 is a photograph illustrating a photoresist pattern obtained from Example 4.

Then, the photoresist film was post-baked in the oven at 130° C. for 90 seconds, and then developed in a 2.38 wt % aqueous TMAH solution for 30 seconds to obtain a 150 nm contact hole pattern (see FIG. 3). As a result, it was found that no pattern was formed in the undesired regions in comparison with FIG. 1.

As described above, the disclosed photoresist cleaning solutions comprising $H_2O$ and a nonionic surfactant compound represented by Formula 1 as an additive, were sprayed on a semiconductor substrate before or after an exposure process for formation of photoresist pattern, thereby preventing the formation of unnecessary patterns generated in undesired regions by eliminating the acid damage to the unexposed polymer matrix.

What is claimed is:

1. A method for forming a photoresist pattern, comprising the steps of:
   (a) coating a photoresist on the surface of an underlying layer formed on a semiconductor substrate to form a photoresist film;
   (b) soft-baking the photoresist film;
   (c) exposing the photoresist film to light;
   (d) post-baking the photoresist film; and
   (e) developing the photoresist film to form a photoresist pattern, wherein the method further comprises cleaning the photoresist film using a photoresist cleaning solution comprising $H_2O$ and a nonionic surfactant compound represented by Formula 1 after step (b) and before step (c) or after step (c) and before step (d):

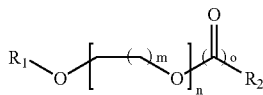

Formula 1 wherein
$R_1$ and $R_2$ are independently H, $C_1$-$C_{20}$ alkyl, $C_5$-$C_{25}$ alkyl aryl or $C_1$-$C_{10}$ ester;
m is 1 or 2;
n is an integer ranging from 10 to 300; and
o is 0 or 1.

2. The method according to claim 1, wherein $R_1$ and $R_2$ are independently H, $C_1$-$C_{12}$ alkyl, $C_{12}$-$C_{20}$ alkyl aryl or $C_1$-$C_8$ ester; and n is an integer ranging from 50 to 150.

3. The method according to claim 2, wherein $R_1$ and $R_2$ are independently selected from the group consisting of H, octyl, octyl phenyl, nonyl, nonyl phenyl, decyl, decyl phenyl, undecyl, undecyl phenyl, dodecyl and dodecyl, phenyl.

4. The method according to claim 1, wherein the compound of Formula 1 is polyethylene glycol or polyethylene glycol monolaurate.

5. The method according to claim 1, wherein the nonionic surfactant compound of Formula 1 is present in an amount ranging from 0.001 wt % to 1 wt % based on total weight of the solution.

6. The method according to claim 5, wherein the content of the nonionic surfactant compound of Formula 1 is from 0.005 wt % to 0.05 wt % based on total weight of the solution.

7. The method according to claim 1, further comprising an alcohol.

8. The method according to claim 7, wherein the alcohol is present from 0.01 wt % to 10 wt % based on total weight of the solution.

9. The method according to claim 7, wherein the alcohol is present from 0.01 wt % to 5 wt % based on total weight of the solution.

10. The method according to claim 8, wherein the alcohol is selected from the group consisting of $C_1$-$C_{10}$ alkyl alcohol and $C_1$-$C_{10}$ alkoxyalkyl alcohol.

11. The method according to claim 10, wherein the alcohol is a $C_1$-$C_{10}$ alkyl alcohol selected from the group consisting of methanol, ethanol, propanol, iso-propanol, n-butanol, sec-butanol, t-butanol, 1-pentanol, 2-pentanol, 3-pentanol, and 2,2-dimethyl-1-propanol.

12. The method according to claim 10, wherein the alcohol is a $C_1$-$C_{10}$ alkoxyalkyl alcohol selected from the group consisting of 2-methoxyethanol, 2-(2-methoxyethoxy)ethanol, 1-methoxy-2-propanol, and 3-methoxy-1,2-propanediol.

13. The method according to claim 1, wherein the photoresist cleaning solution comprises one or more of polyethylene glycol and polyethylene glycol monolaurate in an amount ranging from 0.001 wt % to 1 wt %; an alcohol in an amount ranging from 0 to 10 wt %, respectively, and $H_2O$.

14. The method according to claim 13, wherein the alcohol is ethanol.

15. The method according to claim 13, wherein each of polyethylene glycol and polyethylene glycol monolaurate is present in an amount ranging from 0.005 wt % to 0.05 wt %, and the alcohol is present in an amount ranging from 0 to 5 wt %.

16. The method according to claim 1, wherein the exposure light source is selected from the group consisting of KrF (248 nm), ArF (193 nm), VUV (157 nm), EUV (13 nm), E-beam, X-ray, and ion beam.

* * * * *